United States Patent [19]

Konicek

[11] Patent Number: 4,503,112
[45] Date of Patent: Mar. 5, 1985

[54] PRINTED CIRCUIT MATERIAL

[75] Inventor: Jiri K. Konicek, Bennington, Vt.

[73] Assignee: Oak Industries Inc., Rancho Bernardo, Calif.

[21] Appl. No.: 490,983

[22] Filed: May 5, 1983

Related U.S. Application Data

[62] Division of Ser. No. 272,988, Jun. 12, 1981, Pat. No. 4,394,419.

[51] Int. Cl.$^3$ .................... C23F 1/00; C25D 5/10
[52] U.S. Cl. .................... 428/216; 428/209; 428/901; 428/416; 428/418; 428/624; 428/607; 428/626; 428/644; 428/645; 428/646; 428/647; 428/674; 428/675; 428/650; 428/681; 428/215; 148/31.5; 156/151
[58] Field of Search ............... 428/201, 209, 901, 215, 428/216, 416, 418, 624, 607, 626, 644, 645, 646, 647, 674, 675, 680–681; 148/31.5; 156/151; 204/40

[56] References Cited

U.S. PATENT DOCUMENTS

| | | | |
|---|---|---|---|
| Re. 29,820 | 10/1978 | Konicek | 156/151 |
| 3,990,926 | 11/1976 | Konicek | 156/151 |
| 4,190,474 | 2/1980 | Berdan et al. | 156/151 |
| 4,260,449 | 4/1981 | Berdan et al. | 428/901 |
| 4,294,877 | 10/1981 | Graham | 428/209 |
| 4,388,136 | 6/1983 | Huie et al. | 428/901 |
| 4,407,883 | 10/1983 | Newton | 428/215 |

Primary Examiner—Veronica O'Keefe
Attorney, Agent, or Firm—Kinzer, Plyer, Dorn & McEachran

[57] ABSTRACT

A product useful in the manufacture of printed circuits includes a carrier layer of copper having a thickness on the order of about 10–15 microns. A thin layer of copper having a thickness in the range of 1–12 microns, and which will provide the conductive path for the printed circuit, is secured to the copper carrier by an intermediate metallic layer positioned therebetween and secured to both layers of copper. The intermediate layer has a thickness in the range of 0.1–2.0 microns and is selected from the group consisting of nickel, a nickel-tin alloy, a nickel-iron alloy, lead and a tin-lead alloy. The intermediate layer adheres sufficiently to the thin layer of copper to prevent removal thereof during the etching process which removes the carrier layer of copper. The described thin metallic foil is bonded upon opposite sides of a suitable dielectric which may be a reinforced or non-reinforced epoxy or any one of a number of other suitable materials for forming the core of a printed circuit board. The core in fact may be formed of one or more printed circuits previously formed to provide what is known in the trade as a multilayer printed circuit board. The process for manufacture of a printed circuit board includes the steps of removing at least the copper carrier and in many applications the intermediate metallic layer protecting the thin layer of copper attached to the dielectric and formation of a circuit using the thin copper layer.

6 Claims, No Drawings

PRINTED CIRCUIT MATERIAL

This is a division of application Ser. No. 272,988, filed June 12, 1981, now U.S. Pat. No. 4,394,419.

SUMMARY OF THE INVENTION

The present invention relates to the field of printed circuits and specifically to an ultra-thin metallic foil useful in the manufacture of such products. The foil may consist of a carrier layer of copper and a thin layer of copper which will ultimately provide the printed circuit paths, with the two copper layers being secured together by an intermediate layer positioned therebetween and selected from the group consisting of nickel, a nickel-tin alloy, a nickel-iron alloy, lead and a tin-lead alloy.

The invention further contemplates the lamination of such composite metallic foils onto opposite sides of a suitable dielectric which will conventionally form the core of a printed circuit.

Another purpose is a foil of the type described in which the intermediate layer provides protection for the ultra-thin layer of copper so as to facilitate removal of the carrier layer by a suitable etchant.

Another purpose is a process for manufacture of such thin metallic foil and subsequent lamination to a reinforced or non-reinforced dielectric core.

Another purpose is a process for using such a thin metallic foil in the manufacture of printed circuits which includes the step of removing the carrier layer of copper by a suitable etchant.

Other purposes will appear in the ensuing specification and claims.

DESCRIPTION OF THE PREFERRED EMBODIMENT

It is conventional in the manufacture of printed circuit boards to begin with a laminate which has a copper foil secured to opposite sides of a core which is conventionally a reinforced or non-reinforced dielectric. Throughout this specification the use of the term "core" is meant to include any one of a variety of core materials, all of which may be reinforced or non-reinforced and may include an epoxy, a polyester, a polyimide, a polytetrafluoroethylene and in some applications a core material which includes previously-formed printed circuits, with this latter construction being commonly known in the trade as a multilayer printed circuit board.

In the process of manufacture of such boards one step is conventionally the addition of a layer of electroless copper, part of which, along with part of the copper of the laminated foil, will ultimately become the circuit pattern. The process includes one or more etching steps in which the undesired or unwanted copper is removed with the remaining copper defining the specified circuit paths or pattern.

The etching process, or the removal of the unwanted copper, has a severely disadvantageous side effect. The printed circuit board must remain in the etching solution a period of time sufficient to remove the unwanted copper, however, the etching solution also will remove side areas of the printed circuit paths. Hence, the printed circuit board designer must take into account, when determining the width of a conductor path the thickness of the original foil which will be removed by the etching solution. For example, if the foil has a thickness of 35 microns, which is the conventional one-ounce foil used in the manufacture of many printed circuits, exposing the printed circuit board to an etching solution for a period of time to remove such a foil thickness will also reduce the width of side areas of the printed circuit paths in approximately the same amount. In fact, since it is customary, in order to insure full removal of unwanted copper, to leave the printed circuit board in an etching solution a period of time sufficient to remove more than the specified thickness of foil, each side of a printed circuit path may be reduced in width by an amount equal to more than the thickness of the foil on the original printed circuit laminate.

As a practical matter, with one-ounce foil, the etching step reduces the minimum width of printed circuit paths which can safely be designed and manufactured with good yields to approximately 200–250 microns. As printed circuit designers have requirements to go to thinner current paths to accomodate state-of-the-art electronics technology, it is mandatory that the thickness of the basic copper foil on the dielectric core be reduced to reduce the time required in an etching solution which will accordingly reduce the undesired reduction in width of a printed circuit path. The ultra-thin foils as described herein provide an economical way of manufacturing PC boards with very fine lines and spaces. This increased conductor density (i.e. packaging density) is a demand created by modern electronics requirements.

Thus, the present invention is specifically directed to providing a copper foil of a thickness in the range of 1–12 microns, with standard sizes at 5 and 9 microns, which foil can then be satisfactorily used in a printed circuit board manufacturing process which will accomodate conductive paths which are quite close together and very thin in width.

Although it may be possible by known processes to manufacture foils of the described thickness, the problems in handling such foil are so prohibitive as to render the manufacture and use, with conventional practices, uneconomical. Foil having a thickness of 35 microns is conventional and the industry is set up to handle such material in large scale laminate manufacturing. Foil having a thickness of 17.5 microns is not uncommon, but there are handling problems in its manufacture to the point where it is marginally profitable to produce laminates with such foils. Foils having a thickness of approximately 13 microns have also been manufactured, but the handling and manufacturing problems are so acute that the use of such foil is not generally considered economical in the industry.

Previous solutions to the thin foil problem have included the placement of the foil upon a carrier, which largely overcomes the handling problem. One such attempt is described in my prior U.S. Pat. No. Re. 29,820 in which a thin layer of copper is deposited upon an aluminum carrier which may be subsequently removed by peeling or by etching.

Another attempted solution which is known in the art was to use a copper carrier with a thin layer of chromium between the copper carrier and the desired thin copper foil. The copper carrier was removed by mechanical peeling, either at the manufacturing location or at the facility of the printed circuit board manufacturer. However, the chromium did not have sufficiently predictable adhesion to the thin copper foil particularly after laminating process, to the point where it was occasionally very difficult or impossible to remove the carrier foil from the top of the thin copper foil rendering it substantially unusable.

The present invention provides a metallic foil suitable for use in the manufacture of printed circuits which includes a carrier layer of copper having a thickness of 10–50 microns and, preferably on the order of about 35 microns in thickness which is the conventional one-ounce thickness used in the printed circuit board trade. A very thin metallic layer is electrodeposited on the copper carrier, in a thickness range of 0.1–2.0. microns, and having a preferred thickness of about 0.5 micron, with this layer being selected from the group consisting of nickel, a nickel-tin alloy, a nickel-iron alloy, lead and a tin-lead alloy. Nickel is a preferred material, but the other described metals may also be satisfactory. Other metals, for example tin, may be useful, however, economically tin is not a particularly satisfactory metal because of a change needed in copper plating bath composition, while the above metals are satisfactorily plated in acid copper bath, which is a standard in copper foil manufacturing.

Specific examples of plating baths which may be used to provide the above-described thin metallic layers are as follows:

| NICKEL | |
|---|---|
| Nickel Sulfate | 300 g/l |
| Nickel Chloride | 30 g/l |
| Boric Acid | 40 g/l |
| pH | 3.0 |
| TIN NICKEL | |
| Stannous Chloride | 50 g/l |
| Nickel Chloride | 300 g/l |
| Ammonium Bifluoride | 65 g/l |
| Ammonium Hydroxide | As needed |
| pH | 2.2 |
| NICKEL - IRON | |
| Nickel Sulfate | 100 g/l |
| Nickel Chloride | 100 g/l |
| Boric Acid | 55 g/l |
| Ferrous Sulfate | 58 g/l |
| Additives | As needed |
| pH | 3.5 |
| LEAD | |
| Lead Fluoroborate | 200 g/l |
| Fluoroboric Acid | 20 g/l |
| Boric Acid | 14 g/l |
| Additives | As needed |
| ACID TIN | |
| Tin Sulphate | 73 g/l |
| Sulfuric Acid | 50 g/l |
| Phenolsulfonic Acid | 40 g/l |
| Gelatin | 2 g/l |
| B—Naphtol | 1 g/l |
| TIN - LEAD | |
| Stannous Tin | 52 g/l |
| Lead | 30 g/l |
| Free Fluoroboric Acid | 125 g/l |
| Peptone | 5 g/l |

After the nickel, and that will be used hereinafter as an example, is deposited on the carrier, a subsequent thin layer of copper, for example having a thickness in the range of 1–12 microns, is deposited on the nickel. This last layer of copper will ultimately become the copper foil on the dielectric core in the final printed circuit manufacturing steps. Although the thickness of the ultimate copper foil will vary depending upon the requirements of the printed circuit manufacturer, standard thicknesses of 5 and 9 microns have been found to be useful. Once the composite foil has been formed as described, it will be treated in the conventional manner of similar copper foils in terms of the adhesion promoting and passivating processes and the various treatment baths that are utilized to prepare the foil for subsequent lamination onto a dielectric core.

As a specific example, a bath suitable for manufacturing the above-described copper foil, whether it be the carrier layer of copper or the described thin layer of copper, would consist of the following:

| Cupric sulfate | 200 g/l |
|---|---|
| Sulfuric acid | 80 g/l |
| Additives (animal glue) | as needed |

As a specific example of a foil manufactured in accordance with the invention, a copper foil with a surface weight of 0.08 oz/sq. ft. (corresponding to 28 microns in thickness) and a width of 53" was deposited onto the outer titanium surface of a rotating drum. The foil was rinsed and dried and then introduced onto a modified treater, consisting of several electroplating and rinsing baths. A layer of nickel was plated onto the copper web from the following bath:

| Nickel sulfate | 300 g/l |
|---|---|
| Nickel chloride | 30 g/l |
| Boric acid | 40 g/l |
| pH approx. 4.0 temp. 46° C. | |

Current density and speed of the foil within the nickel bath were selected to provide a nickel layer of approximately 0.4 microns in thickness. The web was then rinsed and passed through an additional plating bath with a composition as described above. Again, current and speed of the web was selected to deposit a copper layer 4 microns thick upon the previously deposited nickel layer. The foil was again rinsed and dried. Following, the composite foil, having a total thickness of approximately 34 ≠1 micron and consisting of two layers of copper and an intermediate layer of nickel was treated on the outer surface of the thinner of the two copper layers to provide micro-rough surfaces passivation and corrosion protection. Such as treatment is conventional in preparation of copper foil for printed circuit application. Following the latter treatment the foil was dried and rolled onto a reel and was then ready for a subsequent lamination process.

In the lamination process the foil was formed into 50"×38" large sheets. A plurality, in this case eight, epoxy resin coated woven glass prepegs were placed between the treated sides of two copper sheets, as described above, and the laminate was pressed at a temperature of approximately 350+ F. for 2–3 hours. The laminate was cooled and removed from the press and then cut into panels, each of which were 18"×24".

Once the described composite foil has been laminated onto the dielectric core, it is then necessary to remove the carrier layer of copper. This may be done at the facilities of the laminator or it may subsequently be done at the facility of the printed circuit manufacturer. In either case, the copper from the carrier is a recoverable element providing possible economic advantages in the use of this material. The step of removing the carrier may be done in one of several conventional copper etchant solutions, for example in an alkaline cupric chloride-based solution having the following composition:

| | |
|---|---|
| Ammonium chloride | 135 g/l |
| Ammonium hydroxide solution | 300 g/l |
| Dissolved copper | 65 g/l |

It is important for this step that there be complete adherance of the nickel to the underlying thin layer of copper so that the etchant which removes the copper carrier cannot attack the underlying thin foil. The laminated board will be exposed to the described etchant solution a period of time sufficient to remove the carrier layer and the etching process will stop at the nickel barrier layer. Subsequently, the nickel will be removed in a separate etchant, for example by an anodic dissolving in a sulfuric acid solution having the following composition:

| | |
|---|---|
| Sulfuric acid | 170 g/l |
| M—nitrobenzene sulfonic acid | 56 g/l |
| Temp. 50° C. for 30 min. | |

The nickel does not have to be removed in every application, but in the more conventional printed circuit processes the nickel will be removed.

Assuming use as a thin foil product, after the copper carrier and nickel have been removed by etching, the remaining thin foil may be used in conventional printed circuit processes.

There are various processes which are followed in the actual manufacture of printed circuits and the steps will not all be described in detail. Conventionally, holes will be drilled through the copper faced laminate to provide through hole connection between opposite faces or surfaces of the board. Such holes may be drilled either before or after the copper carrier and nickel have been removed. In either case, it is necessary to provide a layer of electroless copper to provide base for through-hole plating. Such a layer of electroless copper will be provided after the drilling step and also after removal of the copper carrier and nickel. The drilling step, however, may be done either before or after removal of the copper carrier and nickel.

Whereas the preferred form of the invention has been shown and described herein, it should be realized that there may be many modifications, substitutions and alterations thereto.

The embodiments of the invention in which an exclusive property or privilege is claimed are as follows:

1. A product useful in the manufacture of printed circuits comprising a dielectric material core including one or more layers of printed circuits and a metallic foil adhered to opposite sides thereof, said metallic foil including,
   (a) a carrier layer of copper fully removable by etching and having a thickness on the order of about 10–35 microns,
   (b) a thin layer of copper having a thickness in the range of 1–12 microns to be used in the formation of electrical circuit paths, with an adhesion promoting and passivating layer on the outer surface which surface is attached to the dielectric material core, and
   (c) an intermediate metallic layer positioned between the (a) and (b) layers and secured thereto, said intermediate layer having a thickness in the range of 0.1–2.0 microns and being selected from the group consisting of nickel, a nickel-tin alloy, a nickel-iron alloy, lead, and a tin-lead alloy, said intermediate layer adhering sufficiently to the (b) layer of copper to prevent removal thereof by an etchant removing the (a) layer of copper.

2. The product of claim 1 further characterized in that said core includes a reinforced epoxy laminate.

3. The product of claim 1 further characterized in that said core includes a polyimide.

4. The product of claim 1 further characterized in that said core includes a polyester.

5. The product of claim 1 further characterized in that said core includes a polytetrafluoroethylene.

6. The product of claim 1 further characterized in that said core includes a non-reinforced dielectric.

* * * * *